(12) United States Patent
Resch

(10) Patent No.: US 10,013,191 B2
(45) Date of Patent: Jul. 3, 2018

(54) ENCODING DATA FOR STORAGE IN A DISPERSED STORAGE NETWORK

(71) Applicant: International Business Machines Corporation, Armonk, NY (US)

(72) Inventor: Jason K. Resch, Chicago, IL (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 154 days.

(21) Appl. No.: 15/221,198

(22) Filed: Jul. 27, 2016

(65) Prior Publication Data

US 2017/0060684 A1    Mar. 2, 2017

Related U.S. Application Data

(60) Provisional application No. 62/211,975, filed on Aug. 31, 2015.

(51) Int. Cl.
*G03F 3/06* (2006.01)
*G06F 3/06* (2006.01)
(Continued)

(52) U.S. Cl.
CPC ............ *G06F 3/0619* (2013.01); *G06F 3/064* (2013.01); *G06F 3/067* (2013.01); *G06F 3/0611* (2013.01);
(Continued)

(58) Field of Classification Search
CPC .... G06F 3/0619; G06F 3/0611; G06F 3/0622; G06F 3/0637; G06F 3/064; G06F 3/0644; G06F 3/0659; G06F 3/0665; G06F 3/067; G06F 3/0689; G06F 11/1076; G06F 11/1092; G06F 11/3034; G06F 11/3409;
(Continued)

(56) References Cited

U.S. PATENT DOCUMENTS 4,092,732 A * 5/1978 Ouchi ................. G06F 11/1076
714/5.11
5,454,101 A * 9/1995 Mackay ............ G06F 17/30952
(Continued)

OTHER PUBLICATIONS

Shamir; How to Share a Secret; Communications of the ACM; vol. 22, No. 11; Nov. 1979; pp. 612-613.
(Continued)

*Primary Examiner* — John J Tabone, Jr.
(74) *Attorney, Agent, or Firm* — Garlick & Markison; Timothy W. Markison; Bruce E. Stuckman

(57) ABSTRACT

A method for execution by a dispersed storage and task (DST) processing unit that includes a processor includes receiving a data object for storage in the DSN via a network. Available storage unit data is generated, indicating a subset of a plurality of storage units of the DSN that corresponds to a plurality of available storage units. A shortened encoding matrix is generated based on an original encoding matrix and the available storage unit data. A size of the shortened encoding matrix is based on a number of storage units in the plurality of available storage units. A plurality of encoded slices is generated, each for transmission to one of the plurality of available storage units via the network, by performing an encoding function on the shortened encoding matrix and the data object.

20 Claims, 7 Drawing Sheets

(51) Int. Cl.
  *G06F 11/10* (2006.01)
  *G06F 12/14* (2006.01)
  *H04L 29/08* (2006.01)
  *G06F 11/30* (2006.01)
  *G06F 11/34* (2006.01)
  *H03M 13/15* (2006.01)

(52) U.S. Cl.
  CPC .......... *G06F 3/0622* (2013.01); *G06F 3/0637* (2013.01); *G06F 3/0644* (2013.01); *G06F 3/0659* (2013.01); *G06F 3/0665* (2013.01); *G06F 3/0689* (2013.01); *G06F 11/1076* (2013.01); *G06F 11/1092* (2013.01); *G06F 11/3034* (2013.01); *G06F 11/3409* (2013.01); *G06F 12/1408* (2013.01); *H04L 67/1097* (2013.01); *G06F 2212/1052* (2013.01); *H03M 13/1515* (2013.01)

(58) Field of Classification Search
  CPC ......... G06F 12/1408; G06F 2212/1052; H04L 67/1097; H03M 13/1515
  USPC ........ 714/764, 766, 768–770, 773, 784, 6.2, 714/6.22, 52, 54
  See application file for complete search history.

(56) References Cited

U.S. PATENT DOCUMENTS

| | | | |
|---|---|---|---|
| 5,485,474 A * | 1/1996 | Rabin | G06F 11/004 714/762 |
| 5,774,643 A | 6/1998 | Lubbers et al. | |
| 5,802,364 A | 9/1998 | Senator et al. | |
| 5,809,285 A * | 9/1998 | Hilland | G06F 3/0608 703/25 |
| 5,890,156 A | 3/1999 | Rekieta et al. | |
| 5,987,622 A | 11/1999 | Lo Verso et al. | |
| 5,991,414 A | 11/1999 | Garay et al. | |
| 6,012,159 A | 1/2000 | Fischer et al. | |
| 6,058,454 A | 5/2000 | Gerlach et al. | |
| 6,128,277 A | 10/2000 | Bruck et al. | |
| 6,175,571 B1 | 1/2001 | Haddock et al. | |
| 6,192,472 B1 | 2/2001 | Garay et al. | |
| 6,256,688 B1 | 7/2001 | Suetaka et al. | |
| 6,272,658 B1 | 8/2001 | Steele et al. | |
| 6,301,604 B1 | 10/2001 | Nojima | |
| 6,356,949 B1 | 3/2002 | Katsandres et al. | |
| 6,366,995 B1 | 4/2002 | Vilkov et al. | |
| 6,374,336 B1 | 4/2002 | Peters et al. | |
| 6,415,373 B1 | 7/2002 | Peters et al. | |
| 6,418,539 B1 | 7/2002 | Walker | |
| 6,449,688 B1 | 9/2002 | Peters et al. | |
| 6,567,948 B2 | 5/2003 | Steele et al. | |
| 6,571,282 B1 | 5/2003 | Bowman-Amuah | |
| 6,609,223 B1 | 8/2003 | Wolfgang | |
| 6,718,361 B1 | 4/2004 | Basani et al. | |
| 6,760,808 B2 | 7/2004 | Peters et al. | |
| 6,785,768 B2 | 8/2004 | Peters et al. | |
| 6,785,783 B2 | 8/2004 | Buckland | |
| 6,826,711 B2 | 11/2004 | Moulton et al. | |
| 6,879,596 B1 | 4/2005 | Dooply | |
| 7,003,688 B1 | 2/2006 | Pittelkow et al. | |
| 7,024,451 B2 | 4/2006 | Jorgenson | |
| 7,024,609 B2 | 4/2006 | Wolfgang et al. | |
| 7,080,101 B1 | 7/2006 | Watson et al. | |
| 7,103,824 B2 | 9/2006 | Halford | |
| 7,103,915 B2 | 9/2006 | Redlich et al. | |
| 7,111,115 B2 | 9/2006 | Peters et al. | |
| 7,140,044 B2 | 11/2006 | Redlich et al. | |
| 7,146,644 B2 | 12/2006 | Redlich et al. | |
| 7,171,493 B2 | 1/2007 | Shu et al. | |
| 7,222,133 B1 | 5/2007 | Raipurkar et al. | |
| 7,240,236 B2 | 7/2007 | Cutts et al. | |
| 7,272,613 B2 | 9/2007 | Sim et al. | |
| 7,636,724 B2 * | 12/2009 | de la Torre | H03M 7/30 |
| 8,230,191 B2 * | 7/2012 | Noguchi | G06F 3/0608 707/999.205 |
| 8,725,684 B1 * | 5/2014 | Wang | G06F 17/30581 707/613 |
| 9,009,575 B2 * | 4/2015 | Dhuse | G06F 11/1076 714/776 |
| 9,411,685 B2 * | 8/2016 | Lee | G06F 11/1076 |
| 9,852,017 B2 * | 12/2017 | Dhuse | G06F 11/0727 |
| 2002/0062422 A1 | 5/2002 | Butterworth et al. | |
| 2002/0166079 A1 | 11/2002 | Ulrich et al. | |
| 2003/0018927 A1 | 1/2003 | Gadir et al. | |
| 2003/0037261 A1 | 2/2003 | Meffert et al. | |
| 2003/0065617 A1 | 4/2003 | Watkins et al. | |
| 2003/0084020 A1 | 5/2003 | Shu | |
| 2004/0024963 A1 | 2/2004 | Talagala et al. | |
| 2004/0122917 A1 | 6/2004 | Menon et al. | |
| 2004/0215998 A1 | 10/2004 | Buxton et al. | |
| 2004/0228493 A1 | 11/2004 | Ma | |
| 2005/0100022 A1 | 5/2005 | Ramprashad | |
| 2005/0114594 A1 | 5/2005 | Corbett et al. | |
| 2005/0125593 A1 | 6/2005 | Karpoff et al. | |
| 2005/0131993 A1 | 6/2005 | Fatula | |
| 2005/0132070 A1 | 6/2005 | Redlich et al. | |
| 2005/0144382 A1 | 6/2005 | Schmisseur | |
| 2005/0229069 A1 | 10/2005 | Hassner et al. | |
| 2006/0047907 A1 | 3/2006 | Shiga et al. | |
| 2006/0136448 A1 | 6/2006 | Cialini et al. | |
| 2006/0156059 A1 | 7/2006 | Kitamura | |
| 2006/0224603 A1 | 10/2006 | Correll | |
| 2007/0079081 A1 | 4/2007 | Gladwin et al. | |
| 2007/0079082 A1 | 4/2007 | Gladwin et al. | |
| 2007/0079083 A1 | 4/2007 | Gladwin et al. | |
| 2007/0088970 A1 | 4/2007 | Buxton et al. | |
| 2007/0174192 A1 | 7/2007 | Gladwin et al. | |
| 2007/0180296 A1 * | 8/2007 | Byrne | G06F 11/1076 714/6.11 |
| 2007/0214285 A1 | 9/2007 | Au et al. | |
| 2007/0234110 A1 | 10/2007 | Soran et al. | |
| 2007/0283167 A1 | 12/2007 | Venters et al. | |
| 2008/0282128 A1 * | 11/2008 | Lee | G06F 11/1068 714/755 |
| 2009/0094251 A1 | 4/2009 | Gladwin et al. | |
| 2009/0094318 A1 | 4/2009 | Gladwin et al. | |
| 2010/0023524 A1 | 1/2010 | Gladwin et al. | |
| 2010/0306621 A1 * | 12/2010 | Cassidy | H03M 13/2707 714/763 |
| 2011/0029711 A1 * | 2/2011 | Dhuse | G06F 11/1076 711/4 |
| 2013/0031414 A1 * | 1/2013 | Dhuse | G06F 11/0727 714/37 |
| 2013/0305060 A9 * | 11/2013 | Resch | H04L 12/00 713/193 |
| 2013/0326167 A1 * | 12/2013 | Dhuse | G06F 11/1088 711/158 |
| 2014/0344227 A1 * | 11/2014 | Grube | G06F 11/1666 707/691 |
| 2014/0359276 A1 * | 12/2014 | Resch | H04L 63/0457 713/153 |
| 2015/0220400 A1 * | 8/2015 | Resch | G06F 11/1464 714/6.2 |
| 2015/0288384 A1 * | 10/2015 | Gladwin | G06F 11/1008 714/763 |
| 2015/0356305 A1 * | 12/2015 | Volvovski | G06F 11/1464 713/164 |
| 2016/0070617 A1 * | 3/2016 | Algie | G06F 11/1076 714/766 |
| 2016/0188218 A1 * | 6/2016 | Gray | H04L 67/1097 711/165 |
| 2017/0004195 A1 * | 1/2017 | Ciborowski | G06F 11/1076 |
| 2017/0075585 A1 * | 3/2017 | Baptist | G06F 3/0605 |

OTHER PUBLICATIONS

Rabin; Efficient Dispersal of Information for Security, Load Balancing, and Fault Tolerance; Journal of the Association for Computer Machinery; vol. 36, No. 2; Apr. 1989; pp. 335-348.

(56) References Cited

OTHER PUBLICATIONS

Chung; An Automatic Data Segmentation Method for 3D Measured Data Points; National Taiwan University; pp. 1-8; 1998.
Plank, T1: Erasure Codes for Storage Applications; FAST2005, 4th Usenix Conference on File Storage Technologies; Dec. 13-16, 2005; pp. 1-74.
Wildi; Java iSCSi Initiator; Master Thesis; Department of Computer and Information Science, University of Konstanz; Feb. 2007; 60 pgs.
Legg; Lightweight Directory Access Protocol (LDAP): Syntaxes and Matching Rules; IETF Network Working Group; RFC 4517; Jun. 2006; pp. 1-50.
Zeilenga; Lightweight Directory Access Protocol (LDAP): Internationalized String Preparation; IETF Network VVorking Group; RFC 4518; Jun. 2006; pp. 1-14.
Smith; Lightweight Directory Access Protocol (LDAP): Uniform Resource Locator; IETF Network Working Group; RFC 4516; Jun. 2006; pp. 1-15.
Smith; Lightweight Directory Access Protocol (LDAP): String Representation of Search Filters; IETF Network Working Group; RFC 4515; Jun. 2006; pp. 1-12.
Zeilenga; Lightweight Directory Access Protocol (LDAP): Directory Information Models; IETF Network Working—Group; RFC 4512; Jun. 2006; pp. 1-49.
Sciberras; Lightweight Directory Access Protocol (LDAP): Schema for User Applications; IETF Network Working Group; RFC 4519; Jun. 2006; pp. 1-33.
Harrison; Lightweight Directory Access Protocol (LDAP): Authentication Methods and Security Mechanisms; IETF Network Working Group; RFC 4513; Jun. 2006; pp. 1-32.
Zeilenga; Lightweight Directory Access Protocol (LDAP): Technical Specification Road Map; IETF Network Working Group; RFC 4510; Jun. 2006; pp. 1-8.
Zeilenga; Lightweight Directory Access Protocol (LDAP): String Representation of Distinguished Names; IETF Network Working Group; RFC 4514; Jun. 2006; pp. 1-15.
Sermersheim; Lightweight Directory Access Protocol (LDAP): The Protocol; IETF Network Working Group; RFC 4511; Jun. 2006; pp. 1-68.
Satran, et al.; Internet Small Computer Systems Interface (iSCSI); IETF Network Working Group; RFC 3720; Apr. 2004; pp. 1-257.
Xin, et al.; Evaluation of Distributed Recovery in Large-Scale Storage Systems; 13th IEEE International Symposium on High Performance Distributed Computing; Jun. 2004; pp. 172-181.
Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

\* cited by examiner

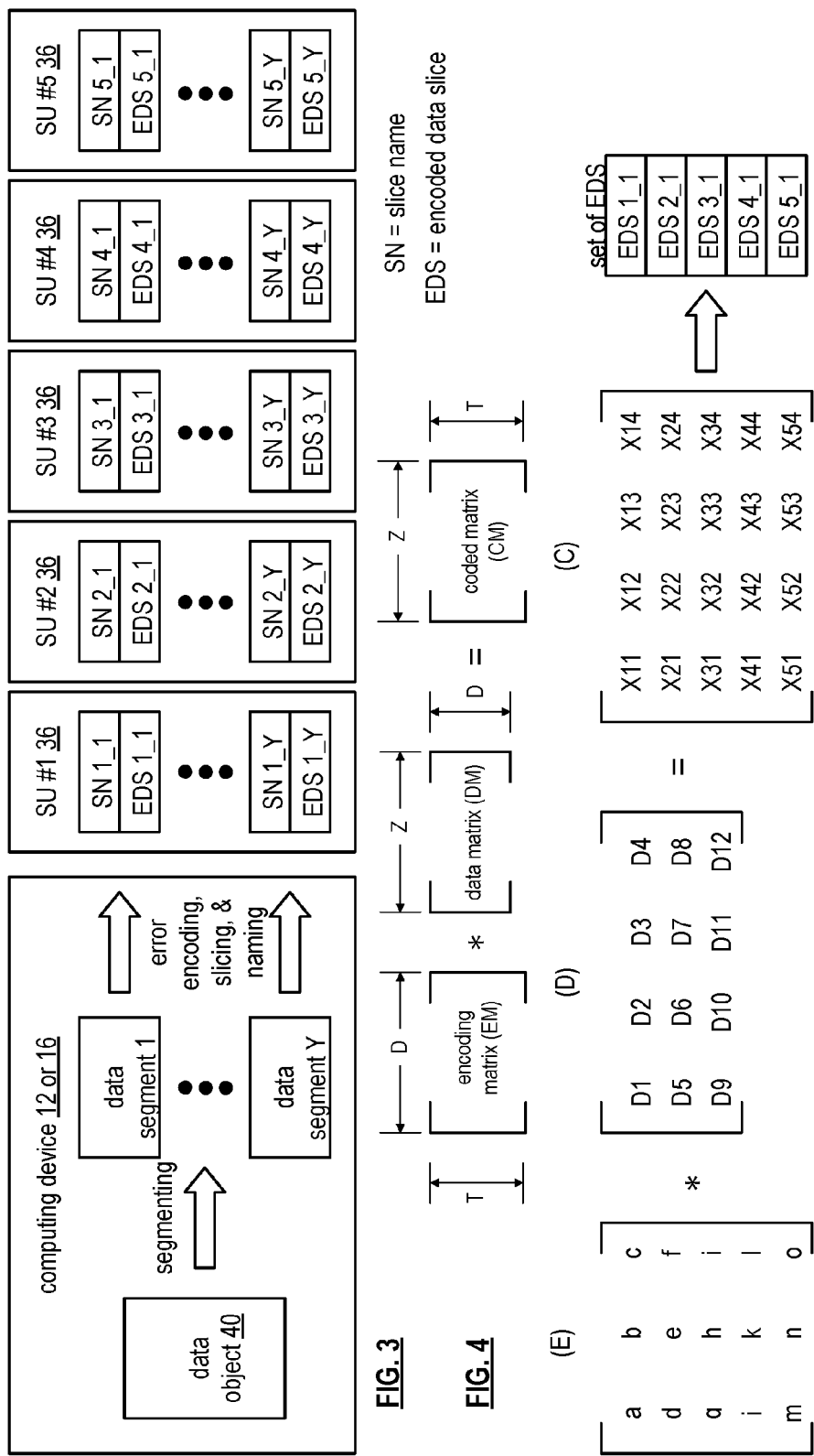

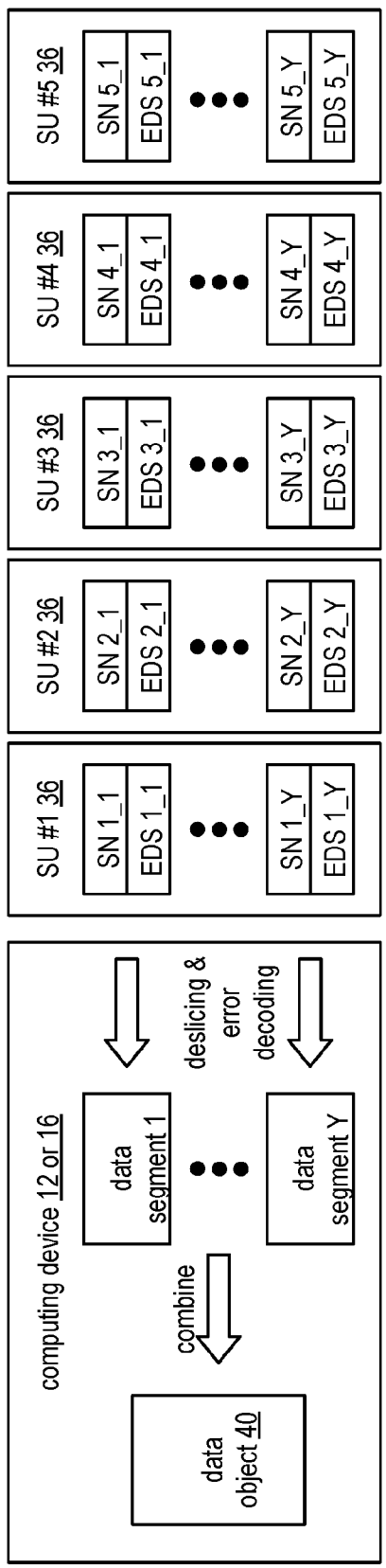

FIG. 10

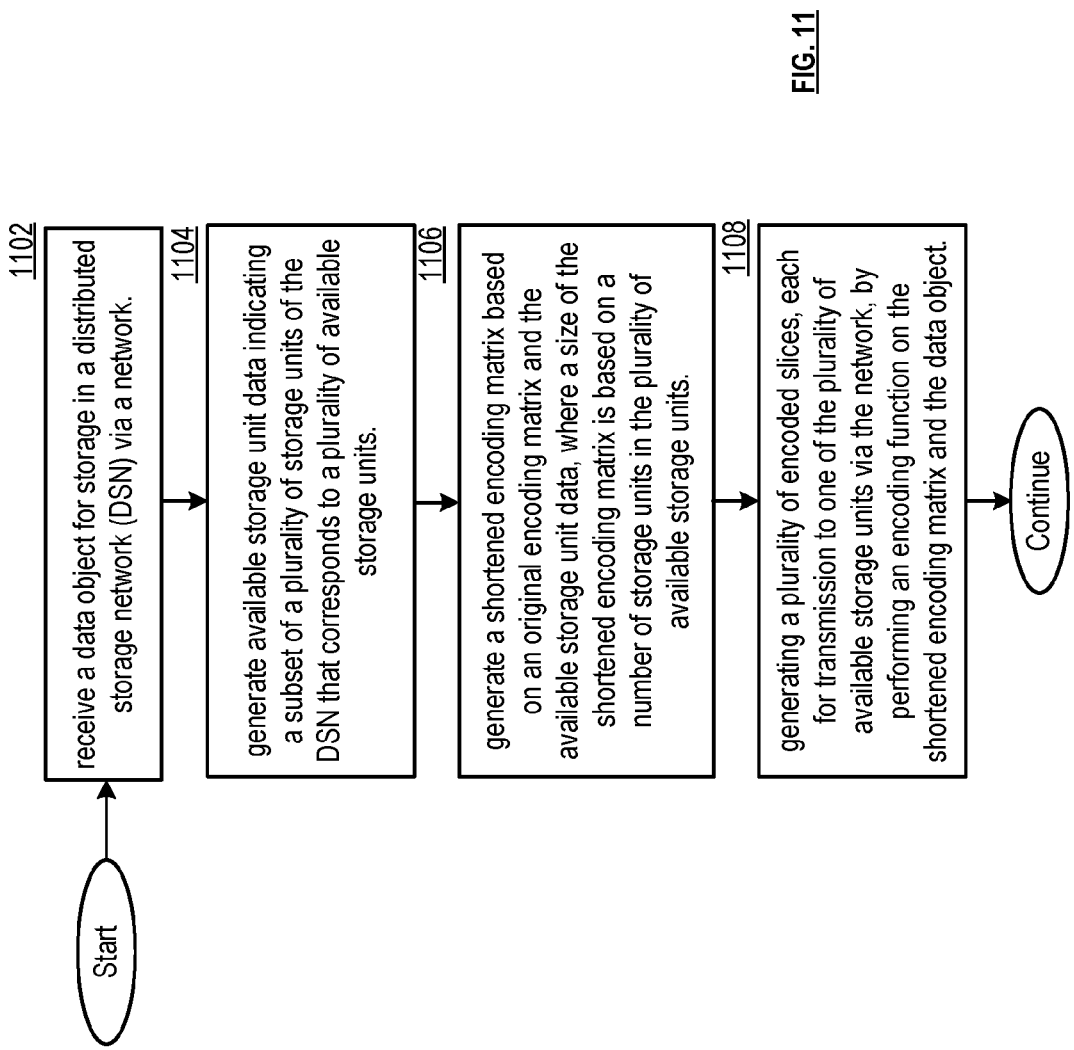

ENCODING DATA FOR STORAGE IN A DISPERSED STORAGE NETWORK

CROSS-REFERENCE TO RELATED APPLICATIONS

The present U.S. Utility Patent Application claims priority pursuant to 35 U.S.C. §119(e) to U.S. Provisional Application No. 62/211,975, entitled "STORING ENCODED DATA SLICES IN A DISPERSED STORAGE NETWORK", filed Aug. 31, 2015, which is hereby incorporated herein by reference in its entirety and made part of the present U.S. Utility Patent Application for all purposes.

STATEMENT REGARDING FEDERALLY SPONSORED RESEARCH OR DEVELOPMENT

Not applicable.

INCORPORATION-BY-REFERENCE OF MATERIAL SUBMITTED ON A COMPACT DISC

Not applicable.

BACKGROUND OF THE INVENTION

Technical Field of the Invention

This invention relates generally to computer networks and more particularly to dispersing error encoded data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

BRIEF DESCRIPTION OF THE SEVERAL VIEWS OF THE DRAWING(S)

FIG. 3 is a schematic block diagram of an example of dispersed storage error encoding of data in accordance with the present invention;

FIG. 4 is a schematic block diagram of a generic example of an error encoding function in accordance with the present invention;

FIG. 5 is a schematic block diagram of a specific example of an error encoding function in accordance with the present invention;

FIG. 6 is a schematic block diagram of an example of a slice name of an encoded data slice (EDS) in accordance with the present invention;

FIG. 7 is a schematic block diagram of an example of dispersed storage error decoding of data in accordance with the present invention;

FIG. 8 is a schematic block diagram of a generic example of an error decoding function in accordance with the present invention;

FIG. 10 is a schematic block diagram of a specific example of an error encoding function in accordance with the present invention; and FIG. 11 is a logic diagram of an example of a method of encoding data for storage in accordance with the present invention.

DETAILED DESCRIPTION OF THE INVENTION

Figure 1:
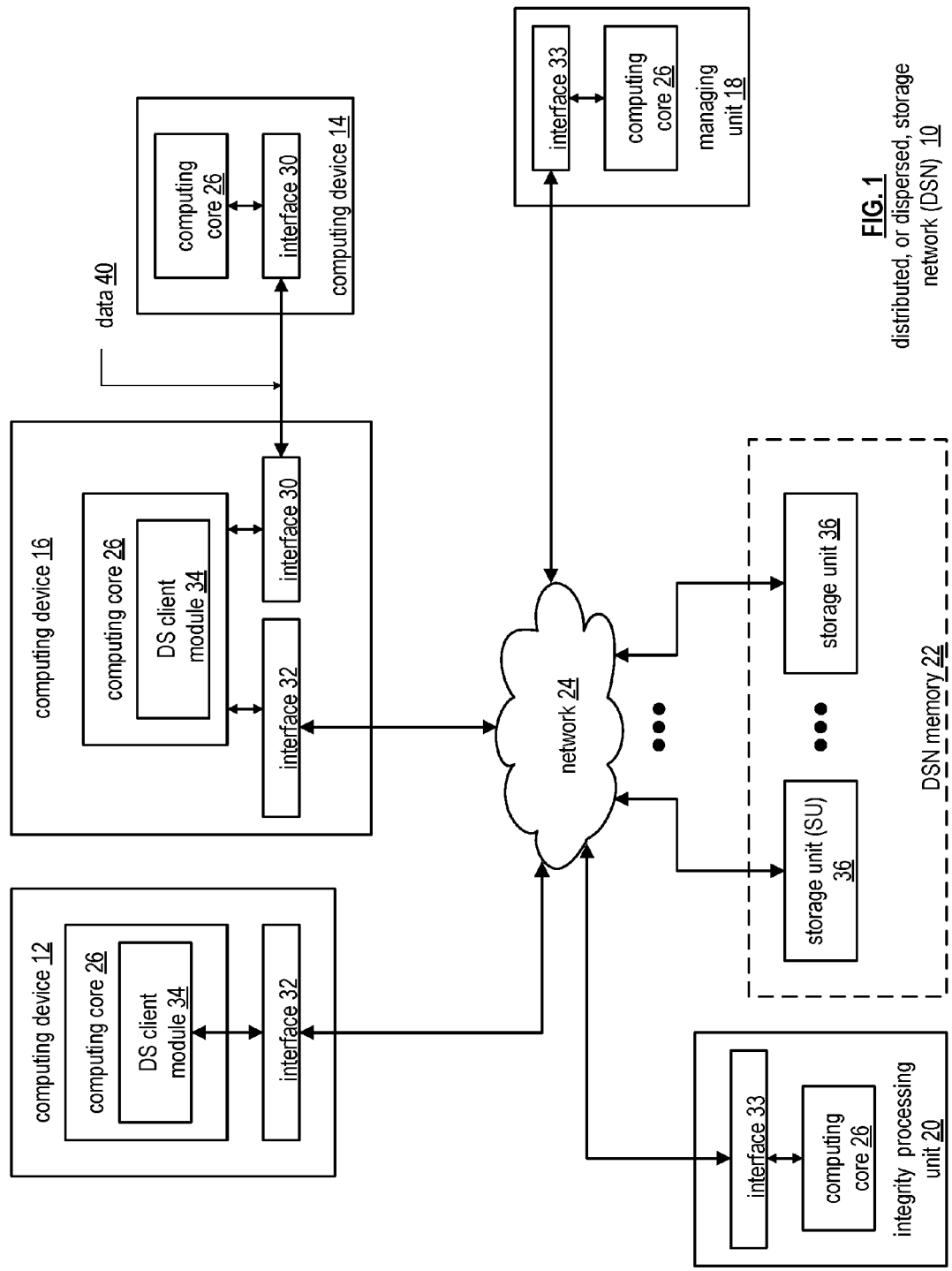
FIG. 1 is a schematic block diagram of an embodiment of a dispersed or distributed storage network (DSN) in accordance with the present invention.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public interne systems; and/or one or more local area networks (LAN) and/or wide area networks (WAN).

Figure 2:
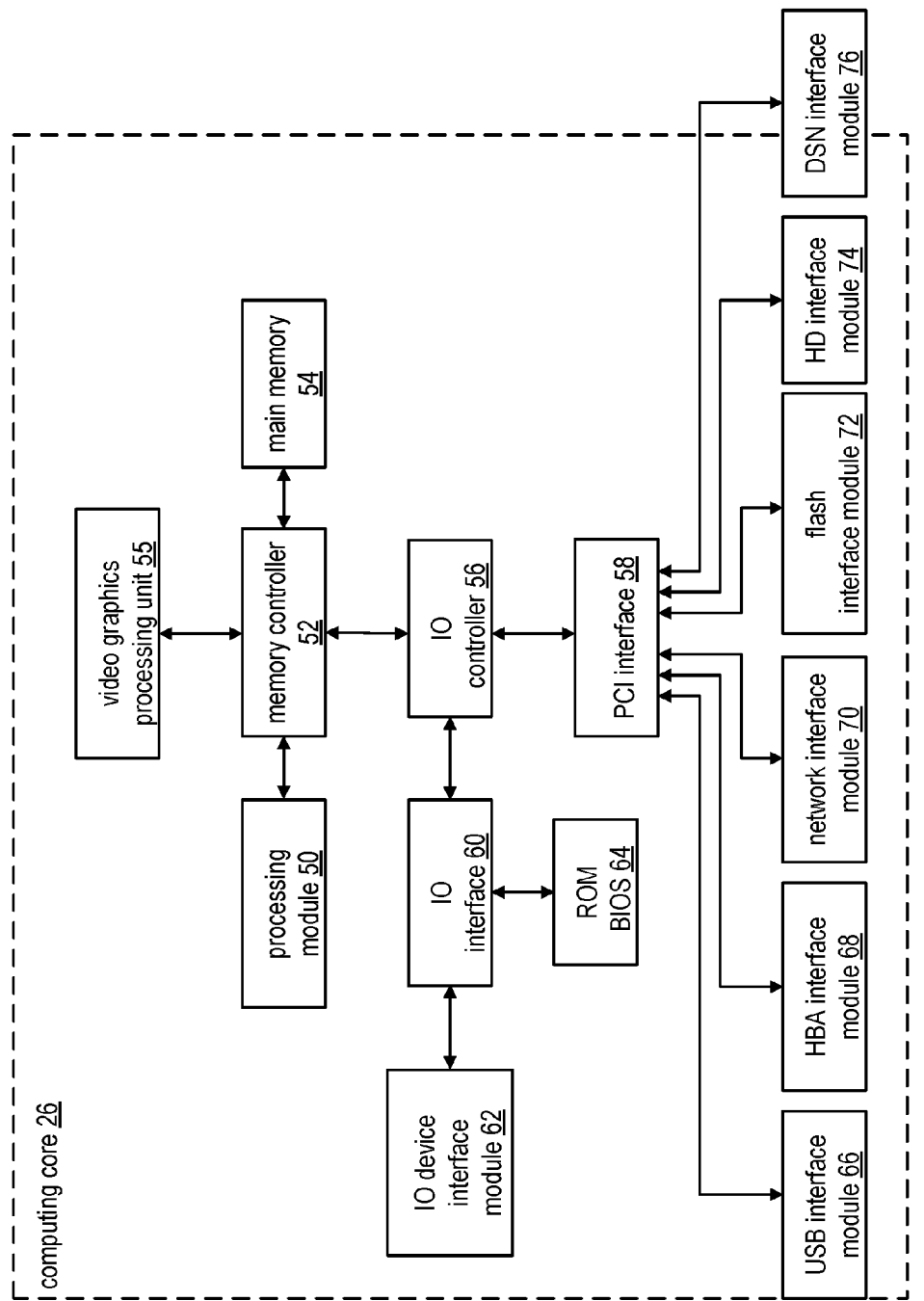
FIG. 2 is a schematic block diagram of an embodiment of a computing core in accordance with the present invention.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36. Further note that each storage unit 36 includes a computing core (as shown in FIG. 2, or components thereof) and a plurality of memory devices for storing dispersed error encoded data.

In various embodiments, each of the storage units operates as a distributed storage and task (DST) execution unit, and is operable to store dispersed error encoded data and/or to execute, in a distributed manner, one or more tasks on data. The tasks may be a simple function (e.g., a mathematical function, a logic function, an identify function, a find function, a search engine function, a replace function, etc.), a complex function (e.g., compression, human and/or computer language translation, text-to-voice conversion, voice-to-text conversion, etc.), multiple simple and/or complex functions, one or more algorithms, one or more applications, etc. Hereafter, a storage unit may be interchangeably referred to as a dispersed storage and task (DST) execution unit and a set of storage units may be interchangeably referred to as a set of DST execution units.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each managing unit 18 and the integrity processing unit 20 may be separate computing devices, may be a common computing device, and/or may be integrated into one or more of the computing devices 12-16 and/or into one or more of the storage units 36. In various embodiments, computing devices 12-16 can include user devices and/or can be utilized by a requesting entity generating access requests, which can include requests to read or write data to storage units in the DSN.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 & 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data as subsequently described with reference to one or more of FIGS. 3-8. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The DSN managing unit 18 creates and stores user profile information (e.g., an access control list (ACL)) in local memory and/or within memory of the DSN memory 22. The user profile information includes authentication information, permissions, and/or the security parameters. The security parameters may include encryption/decryption scheme, one or more encryption keys, key generation scheme, and/or data encoding/decoding scheme.

The DSN managing unit 18 creates billing information for a particular user, a user group, a vault access, public vault access, etc. For instance, the DSN managing unit 18 tracks the number of times a user accesses a non-public vault and/or public vaults, which can be used to generate a per-access billing information. In another instance, the DSN managing unit 18 tracks the amount of data stored and/or retrieved by a user device and/or a user group, which can be used to generate a per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

The integrity processing unit 20 performs rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in the DSN memory 22.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. Here, the computing device stores data object 40, which can include a file (e.g., text, video, audio, etc.), or other data arrangement. The dispersed storage error encoding parameters include an encoding function (e.g., information dispersal algorithm, Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides data object 40 into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number.

Returning to the discussion of FIG. 3, the computing device also creates a slice name (SN) for each encoded data slice (EDS) in the set of encoded data slices. A typical format for a slice name 80 is shown in FIG. 6. As shown, the slice name (SN) 80 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as, at least part of, a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

To recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

Figure 9:
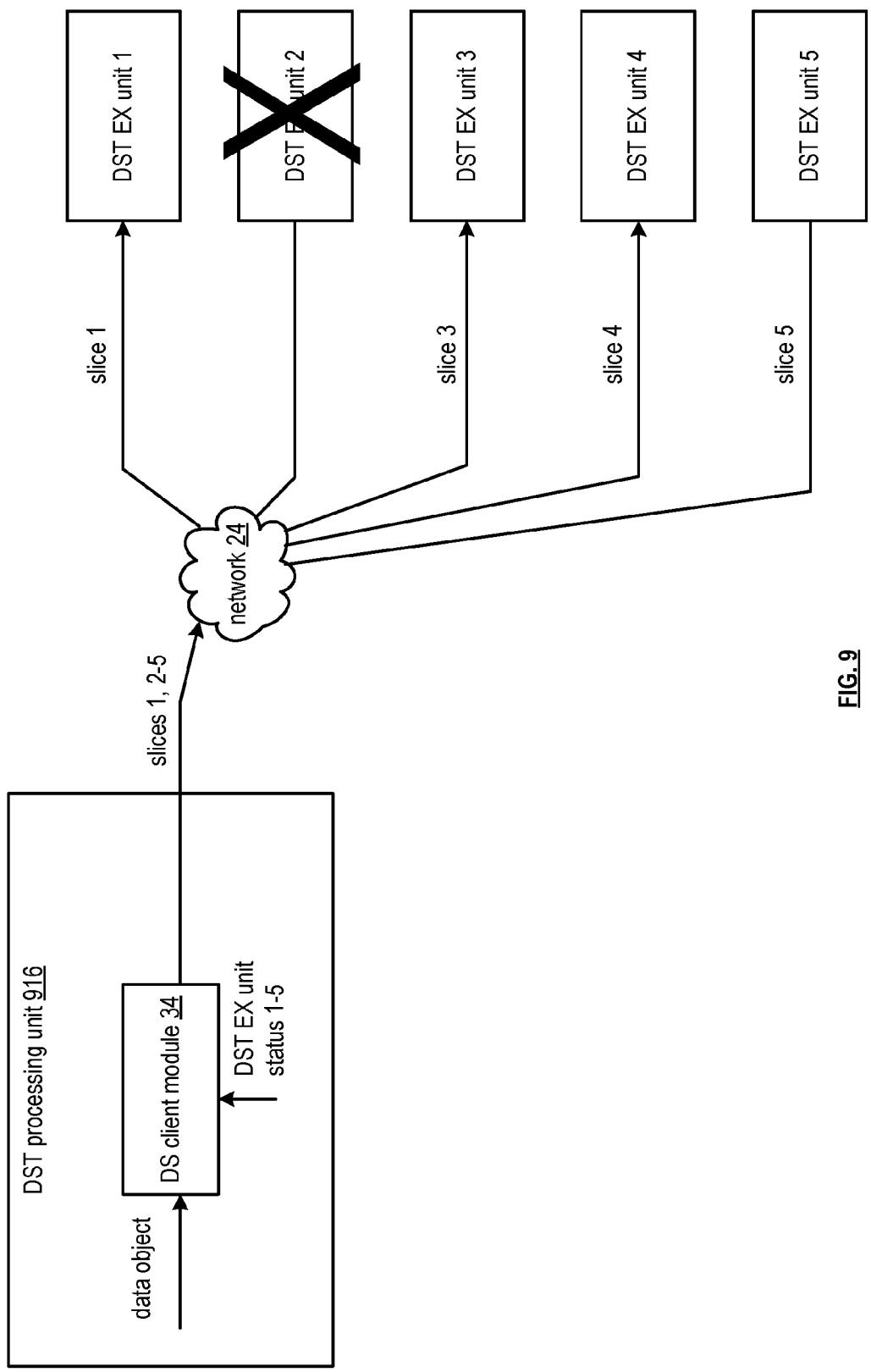
FIG. 9 is a schematic block diagram of an embodiment of a dispersed or distributed storage network (DSN) in accordance with the present invention.

FIG. 9 is a schematic block diagram of another embodiment of a dispersed storage network (DSN) that a district storage and task (DST) processing unit 916, the network 24 of FIG. 1, and a storage set. The DST Processing unit can be utilized by computing device 16 of FIG. 1 functioning as a dispersed storage processing agent for computing device 14 as described previously. The DST processing unit 916 can include the DST client module 34 of FIG. 1. The storage set can include set of DST execution (EX) units 1-5. Alternatively, the storage set may include any number of DST execution units. Hereafter, each DST execution unit may be interchangeably referred to as a storage unit and the storage set may be interchangeably referred to as a set of storage units. The DSN functions to encode data for storage in the DSN.

In many instances, such as Trimmed Writes, Foster Slices, and/or cases when it is known that storage units are down/unavailable/not keeping up with performance, it can be known prior to the time of the write, or prior to the time the slices are computed, that it will not be possible to store some of the slices. In these instances, computational resources can be saved by not computing the full width number of slices, but instead performing a vector-vector multiplication of a vector containing the data elements, and a vector from the encoding matrix corresponding to a slice that is known will be stored. Vectors of the encoding matrix corresponding to slices that will not be written are not multiplied against the data vector. This enables the DST processing unit to compute particular slices on demand, at the time they need to be written, thereby saving the DST processing unit from having to compute the entire width number of slices, as some of which might never be written or need to be written. This same strategy may be used by rebuild modules to recover only those slices that need to be rebuilt.

In an example of operation of the encoding of a data object for storage, for each of the available storage units of the set of storage units, the DST Processing Unit can eliminate a corresponding row of an encoding matrix to produce a shortened encoding matrix, where a number of remaining rows of the shortened encoding matrix includes at least a minimum threshold number of rows (e.g., a decode threshold number, a write threshold number). To accomplish this, the DST processing unit can obtain storage unit status of each storage unit of the set of storage units to identify at least one unavailable storage unit, for example, by requesting information from the storage units, performing a lookup, and/or interpreting results of a test or a previous access scenario. The DST processing unit can obtain an encoding matrix, for example, by interpreting system registry information. The DST processing unit can then eliminate the row of the encoding matrix that corresponds to the unavailable storage unit.

In various embodiments, there may not be enough available storage units to achieve a minimum threshold number of rows in the shortened encoding matrix. The DST storage unit can compare the number of rows in the shortened encoding matrix to the decode threshold number and/or the write threshold number, or compare the number of available storage units to the decode threshold number and/or write threshold number before creating the shortened encoding matrix. If there are not enough available storage units, the DST processing unit can forego storage of the data object. In various embodiments, the DST processing unit can send a notification back to an entity that sent the data object for storage, indicating that the number of available storage units is low and that the data will not be stored at that time. In various embodiments, the DST processing unit will wait for a fixed timeout period, check the storage unit availability again, and then proceed with storage if there are enough available storage units. In various embodiments, the DST processing unit will automatically receive real-time updates indicating if storage units are available, and can wait until the number of available storage units meets the threshold minimum before storing the data object.

In various embodiments, having produced the shortened encoding matrix, the received data object can be divided into at least one data segment as previously discusses. For each of these data segments, the DST processing unit can multiply the shortened encoding matrix by a data matrix to produce a coded matrix as discussed previously, using the shortened encoding matrix instead of the usual encoding matrix. The data matrix can be produced by encoding a data segment into a plurality of data blocks as discussed previously. The DST processing unit can obtain the data segment, encode the data segment into the plurality of data blocks to produce the data matrix, and perform matrix multiplication on the shortened encoding matrix and the data matrix to produce the coded matrix.

In various embodiments, having produced a coded matrix corresponding to each data segment, the DST processing unit can extract encoded data slices from each coded matrix. For example, the DST processing unit can interpret each row of each coded matrix as a unique encoded data slice. Having extracted the encoded data slices, for each extracted encoded data slice, the DST processing unit can send, via the network 24, the extracted encoded data slice to a corresponding storage unit for storage. For example, the DST processing unit sends encoded data slice 1 to DST execution unit 1, encoded data slice 3 to DST execution unit 3, etc.

Figure 10:
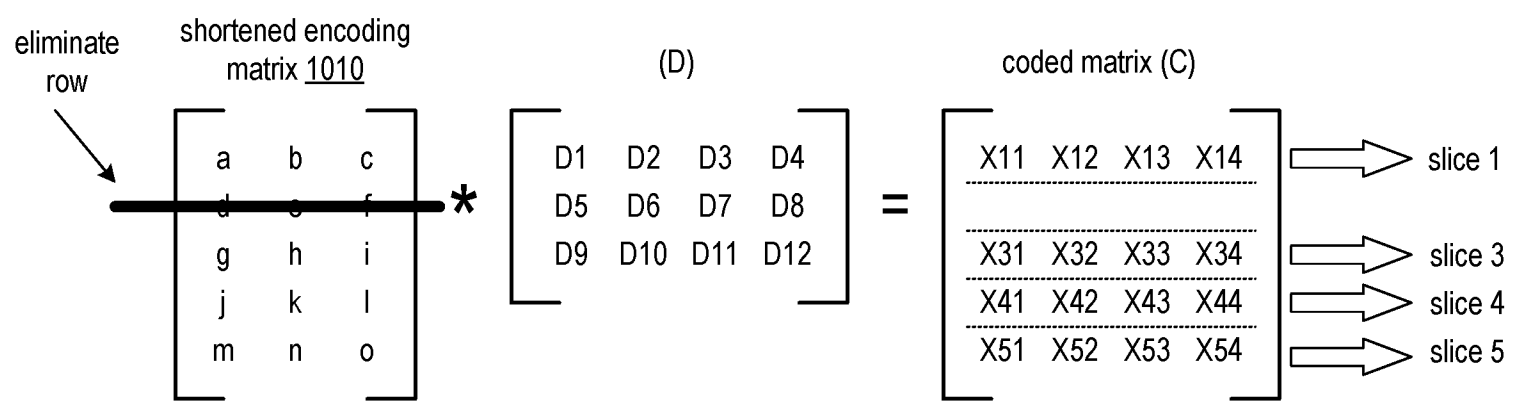

FIG. 10 is a diagram illustrating an example of matrix multiplication of a shortened encoding matrix and a data matrix (D) using a dispersed storage error encoding function to produce a coded matrix (C), where a group of encoded data slices are produced from the coded matrix. In an example of operation of using a Reed Solomon encoding function, a data segment is converted into data blocks (e.g., D1-D12) of a portion of a data matrix (D). A row of an encoding matrix is eliminated to produce a shortened encoding matrix 1010, where the eliminated row corresponds to an unavailable storage unit. For example, a second row of the encoding matrix is eliminated when a second storage unit of a set of five storage units is unavailable. In various embodiments where multiple storage units are unavailable, multiple corresponding rows can be eliminated.

The shortened encoding matrix 1010 is matrix multiplied by the data matrix (D) to produce the coded matrix (C). As a specific example, the dispersed storage error encoding utilizes an error coding number of five (e.g., width of 5) and a decode threshold number of three. The encoding matrix (E) can include five rows of three coefficients (e.g., a-o). When one row is eliminated, the shortened encoding matrix includes 4 rows and 3 columns. The data segment can be divided into data blocks D1-12 which are arranged into the portion of the data matrix (D) having 3 rows of 4 data blocks when the number of data blocks is 12. The number of rows of the data matrix matches the number of columns of the shortened encoding matrix (e.g., the decode threshold number). The number of columns of the data matrix increases as the number of data blocks of the data segment increases. The data matrix can be matrix multiplied by the shortened encoding matrix to produce the coded matrix, which includes 4 rows of 4 encoded data blocks (e.g., X11-X14, X31-X34, X41-X44, and X51-X54). The number of rows of the coded matrix matches the number of rows of the shortened encoding matrix (e.g., the error coding number). For instance, $X11=aD1+bD5+cD9$; $X12=aD2+bD6+cD10$; $X34=gD4+hD8+iD12$; and $X54=mD4+nD8+oD12$.

One or more encoded data blocks from each row of the coded matrix can be selected to form a corresponding encoded data slice of a group of encoded data slices. For example, coded values X11-X14 are selected to produce an encoded data slice 1, coded values X31-X34 are selected to produce an encoded data slice 3, coded values X41-X44 are selected to produce an encoded data slice 4, and coded values X51-X54 are selected to produce an encoded data slice 5. The data matrix (e.g., the data segment) can be recovered (e.g., to produce a recovered data segment) when any decode threshold number of corruption-free error coded data slices are available of the group of error coded data slices. Alternatively, the recovered data segment may be reproduced when a decode threshold number of encoded data blocks for each column of the coded matrix are available.

In various embodiments, a processing system of a dispersed storage and task (DST) processing unit includes at least one processor and a memory that stores operational instructions, that when executed by the at least one processor cause the processing system to receive a data object for storage in the DSN via a network. Available storage unit data is generated, indicating a subset of a plurality of storage units of the DSN that corresponds to a plurality of available storage units. A shortened encoding matrix is generated based on an original encoding matrix and the available storage unit data. A size of the shortened encoding matrix is based on a number of storage units in the plurality of available storage units. A plurality of encoded slices is generated, each for transmission to one of the plurality of available storage units via the network, by performing an encoding function on the shortened encoding matrix and the data object.

In various embodiments, the plurality of available storage units is a proper subset of the plurality of storage units. The shortened encoding matrix is generated by eliminating at least one row from the original encoding matrix. The at least one row corresponds to at least one unavailable storage unit not included in the subset. In various embodiments, the shortened encoding matrix includes at least a number of rows corresponding a decode threshold number and/or a write threshold number. In various embodiments, generating the available storage unit data includes comparing the number of storage units in the plurality of available storage units to a decode threshold number and/or a write threshold number. The shortened encoding matrix and plurality of encoded slices are generated when the available storage unit data indicates that the number of storage units in the plurality of available storage units is greater than or equal to the decode threshold number and/or the write threshold number. In various embodiments, a low storage unit availability notification is generated for transmission via the network when the available storage unit data indicates that the number of storage units in the plurality of available storage units is less than the decode threshold number and/or the write threshold number, indicating that the DST processing unit will forego storage of the data object.

In various embodiments, generating the plurality of encoded slices includes dividing the data object into at least one data segment, generating a data matrix corresponding to each data segment, multiplying each data matrix by the shorting encoding matrix to produce at least one coded matrix, and extracting the plurality of encoded slices from the at least one coded matrix.

In various embodiments, storage unit status data is received via the network. The available storage unit data is generated based on the storage unit status data. In various embodiments, a plurality of status requests are generated for transmission to a plurality of storage units. The storage unit status data is received from the plurality of storage units in response to the plurality of status requests. In various embodiments, generating the available storage unit data includes interpreting results of a test and/or interpreting results of a previous access.

FIG. 11 is a flowchart illustrating an example of encoding data for storage. In particular, a method is presented for use in association with one or more functions and features described in conjunction with FIGS. 1-9, for execution by a dispersed storage and task (DST) processing unit that includes a processor or via another processing system of a dispersed storage network that includes at least one processor and memory that stores instruction that configure the processor or processors to perform the steps described below. Step 1102 includes receiving a data object for storage in a distributed storage network (DSN) via a network. Step 1104 includes generating available storage unit data indicating a subset of a plurality of storage units of the DSN that corresponds to a plurality of available storage units. Step 1106 includes generating a shortened encoding matrix based on an original encoding matrix and the available storage unit data, where a size of the shortened encoding matrix is based on a number of storage units in the plurality of available storage units. Step 1108 includes generating a plurality of encoded slices, each for transmission to one of the plurality of available storage units via the network, by performing an encoding function on the shortened encoding matrix and the data object.

In various embodiments, the plurality of available storage units is a proper subset of the plurality of storage units. The shortened encoding matrix is generated by eliminating at least one row from the original encoding matrix. The at least one row corresponds to at least one unavailable storage unit not included in the subset. In various embodiments, the shortened encoding matrix includes at least a number of rows corresponding a decode threshold number and/or a write threshold number. In various embodiments, generating the available storage unit data includes comparing the number of storage units in the plurality of available storage units to a decode threshold number and/or a write threshold number. The shortened encoding matrix and plurality of encoded slices are generated when the available storage unit data indicates that the number of storage units in the plurality of available storage units is greater than or equal to the decode threshold number and/or the write threshold number. In various embodiments, a low storage unit availability notification is generated for transmission via the network when the available storage unit data indicates that the number of storage units in the plurality of available storage units is less than the decode threshold number and/or the write threshold number, indicating that the DST processing unit will forego storage of the data object.

In various embodiments, generating the plurality of encoded slices includes dividing the data object into at least one data segment, generating a data matrix corresponding to each data segment, multiplying each data matrix by the shorting encoding matrix to produce at least one coded matrix, and extracting the plurality of encoded slices from the at least one coded matrix.

In various embodiments, storage unit status data is received via the network. The available storage unit data is generated based on the storage unit status data. In various embodiments, a plurality of status requests are generated for transmission to a plurality of storage units. The storage unit status data is received from the plurality of storage units in response to the plurality of status requests. In various embodiments, generating the available storage unit data includes interpreting results of a test and/or interpreting results of a previous access.

In various embodiments, a non-transitory computer readable storage medium includes at least one memory section that stores operational instructions that, when executed by a processing system of a dispersed storage network (DSN) that includes a processor and a memory, causes the processing system to receive a data object for storage in the DSN via a network. Available storage unit data is generated, indicating a subset of a plurality of storage units of the DSN that corresponds to a plurality of available storage units. A shortened encoding matrix is generated based on an original encoding matrix and the available storage unit data. A size of the shortened encoding matrix is based on a number of storage units in the plurality of available storage units. A plurality of encoded slices is generated, each for transmission to one of the plurality of available storage units via the network, by performing an encoding function on the shortened encoding matrix and the data object.

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as ' data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method for execution by a dispersed storage and task (DST) processing unit that includes a processor, the method comprises:
   receiving a data object for storage in a distributed storage network (DSN) via a network;
   generating available storage unit data indicating a subset of a plurality of storage units of the DSN that corresponds to a plurality of available storage units;
   generating a shortened encoding matrix based on an original encoding matrix and the available storage unit data, wherein a size of the shortened encoding matrix is based on a number of storage units in the plurality of available storage units; and
   generating a plurality of encoded slices, each for transmission to one of the plurality of available storage units via the network, by performing an encoding function on the shortened encoding matrix and the data object.

2. The method of claim 1, wherein the plurality of available storage units is a proper subset of the plurality of storage units, wherein the shortened encoding matrix is generated by eliminating at least one row from the original encoding matrix, and wherein the at least one row corresponds to at least one unavailable storage unit not included in the subset.

3. The method of claim 1, wherein the shortened encoding matrix includes at least a number of rows corresponding to one of: a decode threshold number or a write threshold number.

4. The method of claim 1, wherein generating the available storage unit data includes comparing the number of storage units in the plurality of available storage units to at least one of: a decode threshold number or a write threshold number, and wherein the shortened encoding matrix and plurality of encoded slices are generated when the available storage unit data indicates that the number of storage units in the plurality of available storage units is greater than or equal to the at least one of: the decode threshold number or the write threshold number.

5. The method of claim 4, further comprising generating a low storage unit availability notification for transmission via the network when the available storage unit data indicates that the number of storage units in the plurality of available storage units is less than the at least one of: the decode threshold number or the write threshold number, indicating that the DST processing unit will forego storage of the data object.

6. The method of claim 1, wherein generating the plurality of encoded slices includes dividing the data object into at least one data segment, generating a data matrix corresponding to each data segment, multiplying each data matrix by the shorting encoding matrix to produce at least one coded matrix, and extracting the plurality of encoded slices from the at least one coded matrix.

7. The method of claim 1, further comprising receiving storage unit status data via the network, wherein generating the available storage unit data is based on the storage unit status data.

8. The method of claim 7, further comprising generating a plurality of status requests for transmission to a plurality of storage units, and wherein the storage unit status data is received from the plurality of storage units in response to the plurality of status requests.

9. The method of claim 1, wherein generating the available storage unit data includes at least one of: interpreting results of a test or interpreting results of a previous access.

10. A processing system of a dispersed storage and task (DST) processing unit comprises:
at least one processor;
a memory that stores operational instructions, that when executed by the at least one processor cause the processing system to:
receive a data object for storage in a distributed storage network (DSN) via a network;
generate available storage unit data indicating a subset of a plurality of storage units of the DSN that corresponds to a plurality of available storage units;
generate a shortened encoding matrix based on an original encoding matrix and the available storage unit data, wherein a size of the shortened encoding matrix is based on a number of storage units in the plurality of available storage units; and
generate a plurality of encoded slices, each for transmission to one of the plurality of available storage units via the network, by performing an encoding function on the shortened encoding matrix and the data object.

11. The processing system of claim 10, wherein the plurality of available storage units is a proper subset of the plurality of storage units, wherein the shortened encoding matrix is generated by eliminating at least one row from the original encoding matrix, and wherein the at least one row corresponds to at least one unavailable storage unit not included in the subset.

12. The processing system of claim 10, wherein the shortened encoding matrix includes at least a number of rows corresponding to one of: a decode threshold number or a write threshold number.

13. The processing system of claim 10, wherein generating the available storage unit data includes comparing the number of storage units in the plurality of available storage units to at least one of: a decode threshold number or a write threshold number, and wherein the shortened encoding matrix and plurality of encoded slices are generated when the available storage unit data indicates that the number of storage units in the plurality of available storage units is greater than or equal to the at least one of: the decode threshold number or the write threshold number.

14. The processing system of claim 13, wherein the operational instructions, when executed by the at least one processor, further cause the processing system to generate a low storage unit availability notification for transmission via the network when the available storage unit data indicates that the number of storage units in the plurality of available storage units is less than the at least one of: the decode threshold number or the write threshold number, indicating that the DST processing unit will forego storage of the data object.

15. The processing system of claim 10, wherein generating the plurality of encoded slices includes dividing the data object into at least one data segment, generating a data matrix corresponding to each data segment, multiplying each data matrix by the shorting encoding matrix to produce at least one coded matrix, and extracting the plurality of encoded slices from the at least one coded matrix.

16. The processing system of claim 10, wherein the operational instructions, when executed by the at least one processor, further cause the processing system to receive storage unit status data via the network, wherein generating the available storage unit data is based on the storage unit status data.

17. The processing system of claim 16, wherein the operational instructions, when executed by the at least one processor, further cause the processing system to generate a plurality of status requests for transmission to a plurality of storage units, and wherein the storage unit status data is received from the plurality of storage units in response to the plurality of status requests.

18. The processing system of claim 10, wherein generating the available storage unit data includes at least one of: interpreting results of a test or interpreting results of a previous access.

19. A non-transitory computer readable storage medium comprises:
at least one memory section that stores operational instructions that, when executed by a processing system of a dispersed storage network (DSN) that includes a processor and a memory, causes the processing system to:
receive a data object for storage in the DSN via a network;
generate available storage unit data indicating a subset of a plurality of storage units of the DSN that corresponds to a plurality of available storage units;
generate a shortened encoding matrix based on an original encoding matrix and the available storage unit data, wherein a size of the shortened encoding matrix is based on a number of storage units in the plurality of available storage units; and
generate a plurality of encoded slices, each for transmission to one of the plurality of available storage units via the network, by performing an encoding function on the shortened encoding matrix and the data object.

20. The non-transitory computer readable storage medium of claim 19, wherein the plurality of available storage units is a proper subset of the plurality of storage units, wherein the shortened encoding matrix is generated by eliminating at least one row from the original encoding matrix, and wherein the at least one row corresponds to at least one unavailable storage unit not included in the subset.

* * * * *